United States Patent
Fu et al.

(10) Patent No.: US 12,060,637 B2
(45) Date of Patent: Aug. 13, 2024

(54) ACTIVELY COOLED FORELINE TRAP TO REDUCE THROTTLE VALVE DRIFT

(71) Applicant: Applied Materials, Inc., Santa Clara, CA (US)

(72) Inventors: Gaosheng Fu, San Jose, CA (US); Tuan A Nguyen, San Jose, CA (US); Amit Bansal, Milpitas, CA (US); Karthik Janakiraman, San Jose, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 362 days.

(21) Appl. No.: 17/108,583

(22) Filed: Dec. 1, 2020

(65) Prior Publication Data
US 2022/0170151 A1  Jun. 2, 2022

(51) Int. Cl.
C23C 16/44 (2006.01)
H01J 37/32 (2006.01)
H01L 21/67 (2006.01)

(52) U.S. Cl.
CPC ...... C23C 16/4411 (2013.01); C23C 16/4412 (2013.01); H01J 37/32834 (2013.01); H01J 37/32844 (2013.01); H01L 21/67109 (2013.01); *H01L 21/6719* (2013.01)

(58) Field of Classification Search
CPC .............. C23C 16/4411; C23C 16/4412; H01J 37/32834; H01J 37/32844; H01L 21/67109; H01L 21/6719
See application file for complete search history.

(56) References Cited

U.S. PATENT DOCUMENTS

| 4,816,046 A | * | 3/1989 | Maeba | .................. B01D 47/00 96/221 |
| 5,322,567 A | * | 6/1994 | Deaton | ............... C23C 16/4412 118/725 |

(Continued)

FOREIGN PATENT DOCUMENTS

| CN | 101069017 A | 11/2007 |
| CN | 108074944 A | 5/2018 |

(Continued)

OTHER PUBLICATIONS

International Search Report and Written Opinion mailed Mar. 18, 2022 in International Patent Application No. PCT/US2021/060915, 8 pages.

*Primary Examiner* — Jeffrie R Lund
(74) *Attorney, Agent, or Firm* — Kilpatrick Townsend & Stockton LLP

(57) ABSTRACT

Exemplary semiconductor processing systems include a processing chamber defining a processing region. The semiconductor processing systems may include a foreline coupled with the processing chamber. The foreline may define a fluid conduit. The semiconductor processing systems may include a foreline trap coupled with a distal end of the foreline. The semiconductor processing systems may include a removable insert provided within an interior of the foreline trap. The semiconductor processing systems may include a throttle valve coupled with the foreline trap downstream of the removable insert.

10 Claims, 7 Drawing Sheets

(56) References Cited

U.S. PATENT DOCUMENTS

| | | | | |
|---|---|---|---|---|
| 5,827,370 A * | 10/1998 | Gu | ...................... | C23C 16/4412 138/104 |
| 5,860,805 A * | 1/1999 | Landis | .................... | C30B 31/16 432/152 |
| 5,871,813 A * | 2/1999 | Pham | ...................... | B01J 3/002 427/248.1 |
| 6,015,463 A * | 1/2000 | Cox | .................... | C23C 16/4412 118/715 |
| 6,206,971 B1 * | 3/2001 | Umotoy | .............. | C23C 16/4412 55/DIG. 15 |
| 6,255,222 B1 | 7/2001 | Xia et al. | | |
| 6,680,420 B2 * | 1/2004 | Pang | .................... | C23C 16/4412 118/723 MR |
| 6,689,930 B1 * | 2/2004 | Pang | .................... | C23C 16/4405 118/723 MR |
| 6,759,018 B1 * | 7/2004 | Arno | ........................ | B01J 4/001 261/21 |
| 2001/0008618 A1 * | 7/2001 | Comita | ............... | C23C 16/4412 423/210 |
| 2002/0034880 A1 * | 3/2002 | Sakai | ................ | H01J 37/3244 257/E21.252 |
| 2003/0017087 A1 | 1/2003 | Pokharna et al. | | |
| 2006/0180026 A1 * | 8/2006 | Gu | ........................ | B01D 53/002 95/288 |
| 2007/0012402 A1 * | 1/2007 | Sneh | .................... | C23C 16/4412 156/345.29 |
| 2009/0120464 A1 | 5/2009 | Rasheed et al. | | |
| 2009/0211210 A1 * | 8/2009 | Engerran | ............ | C23C 16/4412 55/344 |
| 2009/0317547 A1 * | 12/2009 | Strangman | .......... | C23C 16/4485 118/710 |
| 2010/0166630 A1 * | 7/2010 | Gu | ...................... | B01F 25/4521 422/171 |
| 2012/0222813 A1 * | 9/2012 | Pal | ...................... | C23C 16/4412 156/345.31 |
| 2012/0304930 A1 * | 12/2012 | Verdict | ............... | C23C 16/4412 55/344 |
| 2015/0107771 A1 * | 4/2015 | Kobayashi | ............ | B01D 46/62 118/723 R |
| 2016/0010207 A1 * | 1/2016 | Wang | ................ | H01J 37/32357 118/723 R |
| 2021/0225616 A1 * | 7/2021 | Peng | ................ | H01J 37/32467 |
| 2022/0170151 A1 * | 6/2022 | Fu | ........................ | C23C 16/4412 |

FOREIGN PATENT DOCUMENTS

| | | | | |
|---|---|---|---|---|
| JP | H09-181063 A | | 7/1997 | |
| JP | 2018088339 A | * | 6/2018 | ............ B65H 39/11 |
| TW | 201527581 A | | 7/2015 | |
| WO | 2006-060275 A2 | | 6/2006 | |
| WO | 2020-214618 A1 | | 10/2020 | |

\* cited by examiner

ACTIVELY COOLED FORELINE TRAP TO REDUCE THROTTLE VALVE DRIFT

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

SUMMARY

Exemplary semiconductor processing systems include a processing chamber defining a processing region. The semiconductor processing systems may include a foreline coupled with the processing chamber. The foreline may define a fluid conduit. The semiconductor processing systems may include a foreline trap coupled with a distal end of the foreline. The semiconductor processing systems may include a removable insert provided within an interior of the foreline trap. The semiconductor processing systems may include a throttle valve coupled with the foreline trap downstream of the removable insert.

In some embodiments, the semiconductor processing systems may include a cooling fluid source. The semiconductor processing systems may include a fluid line coupling the cooling fluid source with the removable insert. The removable insert may be characterized by one or more sidewalls that define an open interior. At least one sidewall of the one or more sidewalls may define a plurality of apertures extending through a thickness of the at least one sidewall. Each of the plurality of apertures may have a diameter of between about 3 mm and 25 mm. Each of the plurality of apertures may have a circular shape. Each of the plurality of apertures may have a same diameter. The removable insert may include a solid base coupled with the one or more sidewalls. Each of the one or more sidewalls may have a thickness of less than or about 0.5 inches. The semiconductor processing systems may include an additional foreline coupled with the processing chamber. The foreline trap may include a first inlet fluidly coupled with the foreline. The foreline trap may include a second inlet fluidly coupled with the additional foreline. The foreline trap may include an outlet fluidly coupled with the throttle valve. The removable insert may be disposed downstream of the first inlet and the second inlet and upstream of the outlet. The semiconductor processing systems may include a collar that removably couples the removable insert with the foreline trap.

Some embodiments of the present technology may encompass semiconductor processing systems. The systems may include a processing chamber defining a processing region. The systems may a foreline coupled with the processing chamber. The foreline may define a fluid conduit. The systems may include a removable insert provided within an interior of the fluid conduit. The systems may include a cooling fluid source. The systems may include a fluid line coupling the cooling fluid source with the removable insert. The systems may include a throttle valve coupled with the foreline downstream of the removable insert.

In some embodiments, the foreline may include a foreline trap coupled with the throttle valve. The removable insert may be disposed within the foreline trap. The foreline trap may include a first flange. The removable insert may include a second flange. The systems may include a removable collar that secures the first flange and the second flange together. The removable insert may include an insert body having a cross-shaped cross section. The removable insert may include a solid base coupled with one or more sidewalls that define an open interior. The systems may include a cooling block that couples the fluid line with the solid base. The cooling block may be removably coupled with the solid base. At least one sidewall of the one or more sidewalls may define a plurality of apertures extending through a thickness of the at least one sidewall.

Some embodiments of the present technology may encompass methods of semiconductor processing. The methods may include flowing a precursor into a processing chamber. The methods may include generating a plasma of the precursor within a processing region of the processing chamber. The methods may include depositing a material on a substrate disposed within the processing region. The methods may include venting the precursor from the processing chamber via at least one foreline, a foreline trap, and a throttle valve. A removable insert may be disposed within the foreline trap.

In some embodiments, the methods may include actively cooling the removable insert as the precursor is vented. Actively cooling the removable insert may include circulating a cooling fluid through a cooling block that is coupled with the removable insert.

Such technology may provide numerous benefits over conventional systems and techniques. For example, embodiments of the present technology may utilize an actively cooled insert within a foreline trap to collect residue from process gases prior to the gases reaching a throttle valve. Additionally, the components may allow modification to accommodate any number of chambers or processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
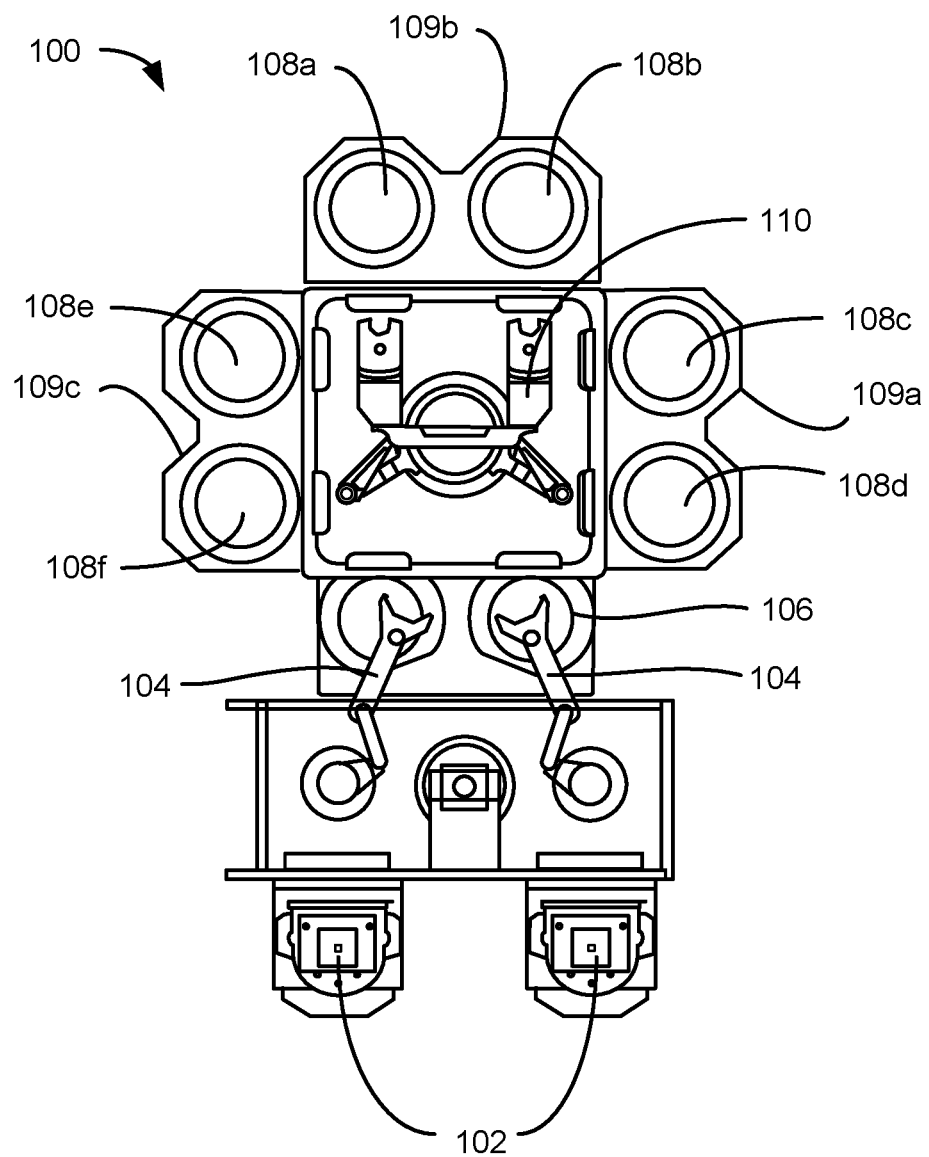
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

Precursors and/or other process gases are often vented from the chamber through a number of forelines. The pressure and fluid conductance of the vented gas may be controlled by one or more throttle valves that are coupled with the forelines. As the precursor passes through the forelines and throttle valve, radicals from the precursor strike the interior of the forelines and throttle valve, causing residue to be deposited on the forelines and throttle valve. As these residues accumulate within the throttle valve, the residue reduces the cross-sectional area of the flow path of the throttle valve, which effectively changes the flow conductance through the throttle valve and causes throttle valve drift. For example, over time the accumulation of residue requires the throttle valve to open to a greater degree (drift) to maintain a desired conductance due to the reduction in cross-sectional area of the flow path. This throttle drift changes the cross-sectional area of the flow path associated with each angle of the throttle valve and, over time, requires the throttle valve to be opened to greater angles to account for the decrease in conductance and change in pressure of gases flowing through the throttle valve. At larger angles, the throttle valve becomes more difficult to control to deliver precise conductance and fluid pressures.

Conventionally, to combat the effects of throttle valve drift, it has been necessary to flush the forelines and throttle valve with high temperature purge gases, such as NF3, that remove the residue and clean the surfaces of the throttle valve. However, these high temperature purge gases may be harmful to chamber components. Therefore, conventional systems must carefully balance the desire to reverse and/or reduce throttle valve drift with the need to minimize the exposure of chamber components to such high temperature purge gases.

The present technology overcomes these challenges by utilizing a foreline trap that receives a removable insert that collects the residue upstream of the throttle valve. The insert may be removed from the foreline trap for cleaning or replacement without the need to clean or replace the forelines or the throttle valve. Embodiments may actively cool the insert, which may further enhance the ability of the insert to collect residues from precursors. Accordingly, the present technology may reduce the occurrence of throttle valve drift and reduce (or eliminate) the need for high temperature throttle valve purges.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
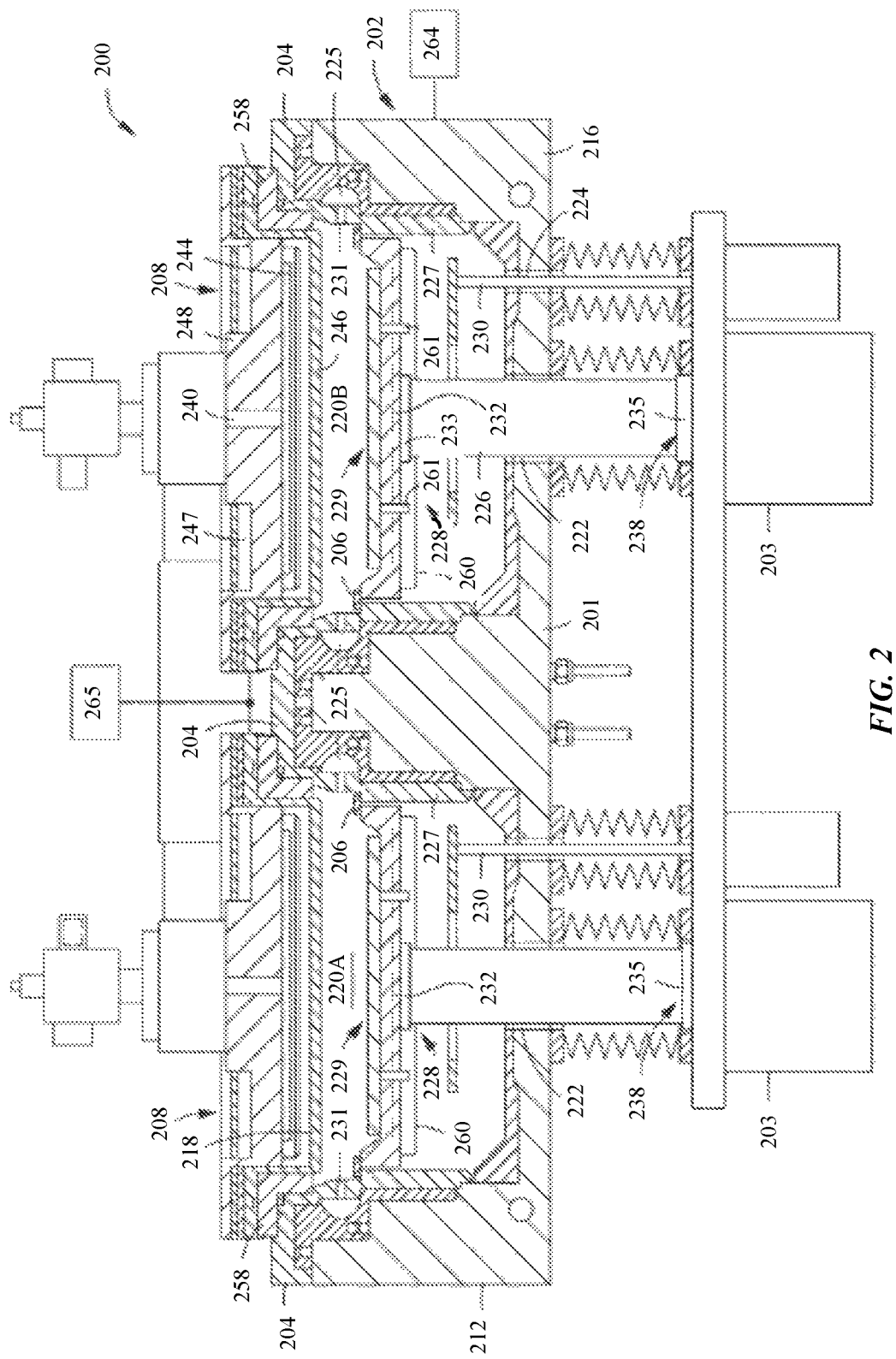
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
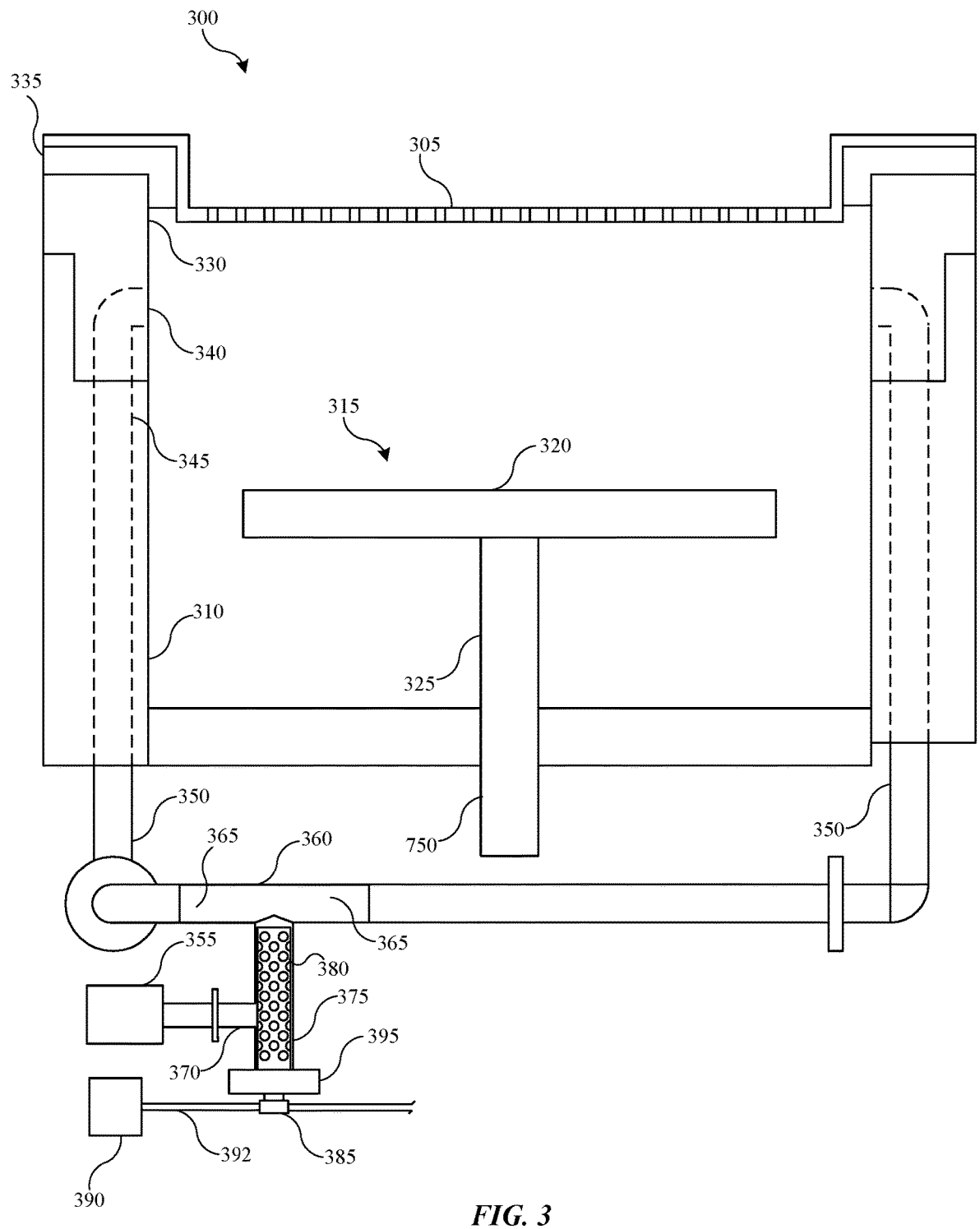
FIG. 3 shows a schematic cross-sectional view of an exemplary processing chamber according to some embodiments of the present technology.

FIG. 3 shows a schematic partial cross-sectional view of an exemplary processing system 300 according to some embodiments of the present technology. FIG. 3 may illustrate further details relating to components in system 200. System 300 is understood to include any feature or aspect of system 200 discussed previously in some embodiments. The system 300 may be used to perform semiconductor processing operations including deposition of hardmask materials as previously described, as well as other deposition, removal, and cleaning operations. System 300 may show a partial view of the chamber components being discussed and that may be incorporated in a semiconductor processing system, and may illustrate a view across a center of the faceplate, which may otherwise be of any size, and include any number of apertures. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma within the processing region of the chamber. The chamber may also include a chamber body 310, which as illustrated may include sidewalls and a base. A pedestal or substrate support 315 may extend through the base of the chamber as previously discussed. The substrate support 315 may include a support plate 320, which may support semiconductor substrate. The support plate 320 may be coupled with a shaft 325, which may extend through the base of the chamber.

The faceplate 305 may be supported, either directly or indirectly, by the chamber body 310. As just one example, the faceplate 305 may be supported atop a pumping liner 330 and/or a isolator or other liner 335. For example, the pumping liner 330 may be seated on a shelf formed by a top of the chamber body 310, with the additional liner 335 and/or faceplate 305 seated atop the pumping liner 330. Pumping liner 330 may define one or more exhaust ports 340 that enable the flow of gases from the processing region to one or more forelines 350 that are coupled with the processing chamber. For example, each exhaust port 340 may be fluidly coupled with a top end of one or more exhaust lumens 345 that are formed within the sidewalls and/or base of the chamber body 310. A bottom end of exhaust lumen 345 may be coupled with a respective one of the forelines 350. Each foreline 350 may define a fluid conduit for flowing process gases out of the processing chamber and directing the process gases through a throttle valve 355, which may control the fluid conductance through the forelines 350. The forelines 350 may be coupled with a foreline trap 360, which may be coupled between a distal end of each foreline 350 and a proximal end of the throttle valve 355. The foreline trap 360 may include inlets 365 that are coupled with each of the forelines 350. For example, in the illustrated embodiment, the foreline trap 360 includes two inlets 365 that are each coupled with a respective one of two forelines 350. The foreline trap 360 may also include an outlet 370 that is fluidly coupled with the throttle valve 355. The foreline trap 360 may also include a trap portion 375 that is disposed between the inlets 365 and the outlet 370, with the inlets 365 being upstream of the trap portion 375 and the outlet 370 being downstream of the trap portion 375. As just one example, the inlets 365 may be coaxial with one another, with the trap portion 375 coupled with the inlets 365 at a generally orthogonal angle such that a T-junction is created. The outlet 370 may branch off from the trap portion 375 at an angle, such as a generally orthogonal angle.

Figure 3A:
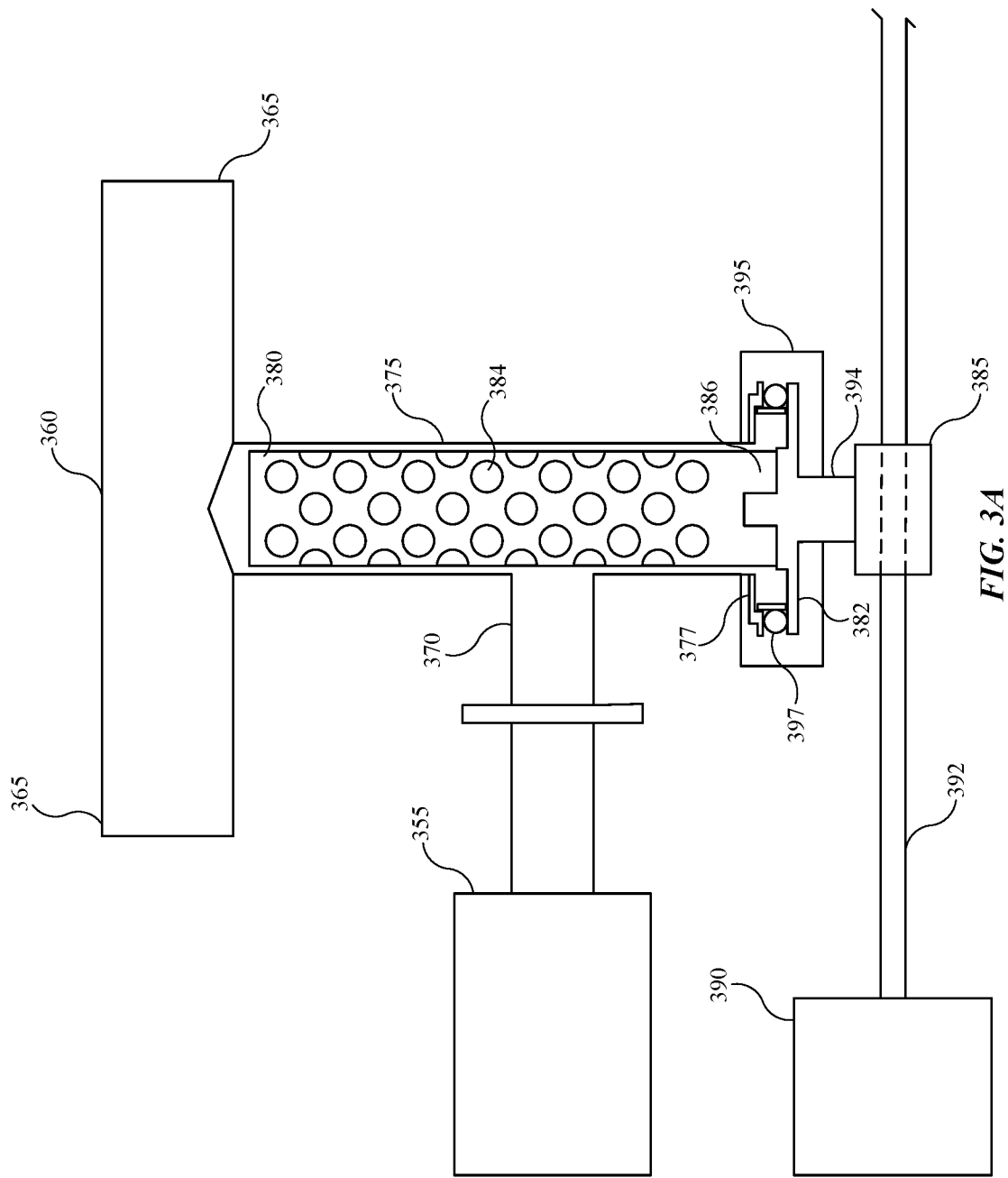
FIG. 3A shows a schematic cross-sectional view of chamber exhaust components according to some embodiments of the present technology.

As best illustrated in FIG. 3A, a removable insert 380 may be provided within an interior of the foreline trap 360. For example, the insert 380 may be disposed within the trap portion 375. The insert 380 may serve as a collection point for residue and/or other deposition caused by radicals from the process gases flowing through the forelines 350 prior to the gases reaching the throttle valve 355. For example, the insert 380 may provide a large surface area on which residue may be deposited prior to the process gases reaching the throttle valve 355. The insert 380 may be of any size and/or shape that fits within the foreline trap 375 while promoting gas flow to the throttle valve 355. For example, as illustrated the insert 380 is a tubular element having one or more sidewalls that define an open interior. The tubular element may have any cross-sectional shape, including circular, elliptical, rectangular, triangular, etc. One or more of the sidewalls of the tubular element may define a number of apertures 384 that extend through a thickness of the respective sidewall. The apertures 384 may maintain sufficient fluid flow conductivity through the foreline trap 360, insert 380, and throttle valve 355, which may also enable the throttle valve 355 to tune flow through the forelines 350 with sufficient precision. The size, number, and/or arrangement of apertures 384 may be selected to be sufficiently large to maintain a proper fluid conductance, while still leaving the insert 380 with sufficient surface area to serve as a collection point for residue from process gases. For example, the apertures 384 may have diameters of between or about 3 mm and about 25 mm, between or about 6 mm and 20 mm, between or about 9 mm and 18 mm, between or about 12 mm and 15 mm, or other range to provide sufficient conductance while providing enough surface area to serve as a residue trap.

While illustrated as having circular apertures, it will be appreciated that other aperture shapes, such as rectangles, triangles, stars, ellipses and/or other closed shapes are possible. In some embodiments, the cross-sectional area of each aperture 384 may be less than or about 500 mm$^2$, less than or about 450 mm$^2$, less than or about 400 mm$^2$, less than or about 350 mm$^2$, less than or about 300 mm$^2$, less than or about 250 mm$^2$, less than or about 200 mm$^2$, less than or about 150 mm$^2$, less than or about 100 mm$^2$, less than or about 50 mm$^2$, less than or about 25 mm$^2$, or less. Additionally, the apertures 384 may be arranged about a surface of the insert in a uniform or non-uniform manner. For example, the apertures 384 may be arranged in a repeating pattern, such as in rows and/or columns, across all or a portion of the surface of the insert 380, while in other embodiments an irregular arrangement of one or more apertures 384 may be utilized. As illustrated, the apertures 384 are arranged in a number of rows, with apertures 384 in adjacent rows being offset from one another. For example, centers of apertures 384 in adjacent rows are not in alignment with one another along a longitudinal axis of the insert 380. In some embodiments, some or all of the rows of apertures 384 may be aligned along the longitudinal axis. In some embodiments, one or more of the sidewalls (or portions thereof) may be devoid of apertures 384. For example, one or more surfaces of the insert 380 that are furthest from the outlet 376 may have no apertures 384, which may provide greater surface area on which residue may be trapped, while surfaces closest to the outlet 376 may include apertures 384 that help maintain sufficient conductance through the forelines 350, foreline trap 360, and throttle valve 355.

In some embodiments, the insert 380 may include a generally solid base 386. For example, as illustrated a solid base 386 is provided below the sidewalls. The base 386 may be entirely solid and/or may otherwise provide a strong foundation for securing the insert 380 within the foreline trap 360. For example, the base 386 and/or foreline trap 360 may include one or more coupling mechanisms that enable the insert 380 to be removably secured in place within the foreline trap 360. As just one example, the trap portion 375 may include a flange 377, such as at a lower end of the trap portion 375. In some embodiments, the insert 380 may include a flange 382, such as a KF flange, which may be formed as part of and/or coupled with the insert 380. As illustrated, the flange 382 is a separate component that may be removably secured to the base 386 of the insert 380. For example, the flange 382 may include a threaded connector or other securement element that may engage with a corresponding connector of the base 386 to couple the flange 382 to the base 386 of the insert 380. This enables the insert 380 to be decoupled from the flange 382 for cleaning, repair, or replacement, while enabling the flange 382 to be reused. To secure the insert 380 within the trap portion 375, the two flanges 377, 382 may be coupled with one another. For example, a collar 395 may be provided that receives and secures the flanges 377, 382 with one another to secure the insert 380 within the trap portion 375. In some embodiments, an O-ring, gasket, or other sealing element 397 may be provided within the collar 395 to help seal the interface between the flange 377 of the foreline trap 360 and the flange 382 of the insert 380. The sealing element 397 may help prevent process gases from leaking out of the collar 395. The collar 395 may be a clamp collar that enables the collar 395 to be released from the flanges 377, 382, which may allow the insert 380 to be readily accessed and removed from the trap for cleaning or replacement. For example, the collar 395 may include a tightening mechanism, such as a threaded fastener mechanism and/or quick disconnect mechanism.

In some embodiments, to further enhance the ability of the insert 380 to collect residue from process gases, the insert 380 may be actively cooled. For example, the insert 380 may be coupled with a cooling block 385 that is coupled with a cooling source. In some embodiments, a bottom end of the base of the insert 380 and/or flange 382 may include a protrusion 394 that projects beyond the collar 395 and couples with the cooling block 385. The protrusion 394 may be removably coupled with the cooling block 385, such as by using a fastener or other coupling mechanism. The cooling block 385 may be coupled with a cooling fluid source 390, such as a process chilled water source, which may supply a circulating fluid to the cooling block 385 via one or more fluid lines 392. In this manner, cooling block 385 may establish a heat transfer path that may lower the temperature of the insert 380 relative to the foreline trap 360 and the gases flowing therethough. For example, the process gases flowing through the forelines 350, foreline trap 360, and/or throttle valve 355 may oftentimes exceed 140° C. or higher. The cooling fluid, which may be water, ethylene glycol, and/or other coolant, may be provided at temperatures of less than or about 100° C., less than or about 90° C., less than or about 80° C., less than or about 70° C., less than or about 60° C., less than or about 50° C., less than or about 40° C., less than or about 30° C., less than or about 25° C., less than or about 20° C., less than or about 15° C., less than or about 10° C., less than or about 5° C., less than or about 0° C., or lower. Such coolant temperatures may result in a temperature of the insert 380 being less than or about less than or about 80° C., less than or about 70° C., less than or about 60° C., less than or about 50° C., less than or about 40° C., less than or about 30° C., less than or about 25° C., less than or about 20° C., less than or about 15° C., less than or about 10° C., less than or about 5° C., less than or about 0° C., or lower. These temperatures are noticeably below the temperature of the process gases, forelines 350, foreline trap 360, and/or throttle valve 355, and therefore help promote collection of residue on the insert 380. The insert 380 may be formed from a thermally conductive material, such as aluminum, that enable the insert 380 to be cooled more effectively by the cooling block to further promote residue deposition. It will be appreciated that the insert 380 may be cooled in an non-uniform manner. For example, a portion of the insert 380 more proximate to the base 386 may be cooled to a greater extent than an upper portion of the insert 380. Moreover, the size and distribution of apertures 384 may impact the cooling properties of the insert 380.

The lower temperatures of the insert 380 may cause residue from the process gases to accumulate on the insert 380 rather than on the warmer walls of the foreline trap 360 and/or within the throttle valve 355. By reducing deposition of residue within the throttle valve 355, the amount of throttle valve drift may be reduced. This may lead to improved performance of the throttle valve 355 and make it easier to consistently control fluid conductance through the forelines 350 and throttle valve 355. Additionally, the residue reduction of deposition within the throttle valve 355 may reduce the frequency of high temperature purge gas cleanings of the throttle valve 355, which may help protect chamber components, such as the heater, from such purge gas flows.

The insert 380 may be designed to not only maintain sufficient fluid conductance, but also to facilitate better cooling, which in turn enhances the ability of the insert 380 to trap or otherwise collect residue from process gases prior to the gases reaching the throttle valve 355. For example, if a thickness and/or cross-sectional area of the sidewalls and/or body of the insert 380 is too large, too much of the open interior of the foreline trap 360 will be filled, resulting in the conductance of the foreline trap 360 and throttle valve 355 being reduced and pressure within the foreline trap 360 and throttle valve 355 being altered from desired operating conditions. The thickness of the sidewalls may be less than or about 0.50 inches, less than or about 0.40 inches, less than or about 0.35 inches, less than or about 0.30 inches, less than or about 0.25 inches, less than or about 0.20 inches, less than or about 0.15 inches, less than or about 0.10 inches, less than or about 0.05 inches, or less. In some embodiments, thickness of the sidewalls of the insert 380 may vary along a length of the insert 380. For example, the thickness of the sidewalls may be greater near the base 386 and decrease in a linear or nonlinear manner in a direction opposite the base 386. The cross-sectional area of the insert 380 may be less than or about 1.6 square inches, less than or about 1.5 square inches, less than or about 1.4 square inches, less than or about 1.3 square inches, less than or about 1.2 square inches, less than or about 1.1 square inches, less than or about 1.0 square inches, less than or about 0.9 square inches, less than or about 0.8 square inches, less than or about 0.7 square inches, less than or about 0.6 square inches, less than or about 0.5 square inches, less than or about 0.45 square inches, less than or about 0.40 square inches, less than or about 0.35 square inches, less than or about 0.30 square inches, less than or about 0.25 square inches, or less. In some embodiments, a cross-sectional area of the insert 380 may vary along a length of the insert 380. For example, the cross-sectional area may be greater near the base 386 and decrease in a linear or nonlinear manner in a direction opposite the base 386.

Figure 4:
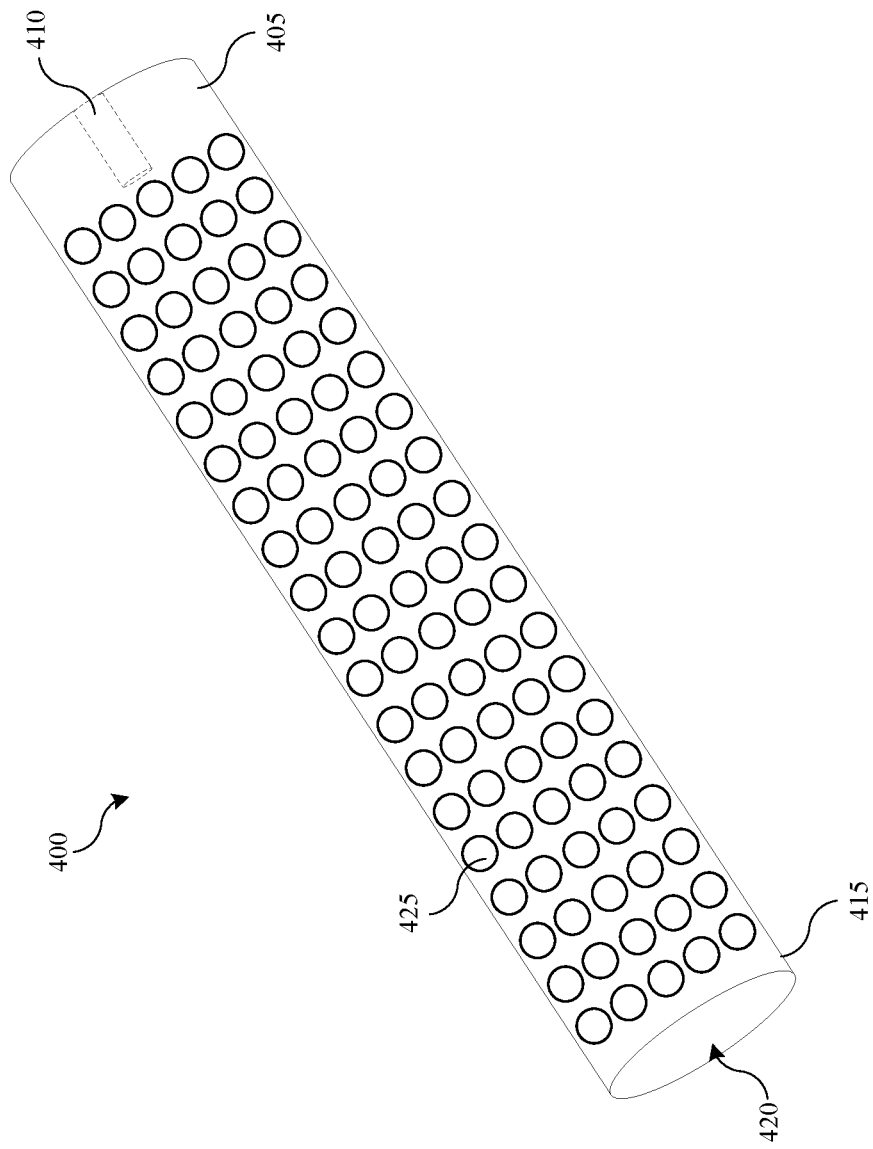
FIG. 4 shows a schematic isometric view of an exemplary removable foreline trap insert according to some embodiments of the present technology.

FIG. 4 shows a schematic isometric view of an exemplary insert 400 according to some embodiments of the present technology. The insert 400 may be included in any chamber or system previously described, as well as any other chamber or system that may benefit from the insert. For example, the insert 400 may be disposed within the trap portion 375 of the foreline trap 360 described above in relation to FIGS. 3 and 3A. The insert 400 may be similar to the insert 380 and may include any of the features described in relation to insert 380. For example, the insert 400 may include a solid base 405. The base 405 may include a coupling mechanism that enables the insert 400 to be coupled with a cooling block (such as cooling block 385) and/or a flange (such as flange 382), which may be used to secure the insert 400 within a foreline trap, such as foreline trap 360. For example, the base 405 may define a threaded receptacle 410 that may receive a threaded male connector of a flange and/or cooling block. In some embodiments, rather than defining a threaded receptacle, the base 405 may include a male threaded connector that is engageable with a corresponding female connector of the flange and/or cooling block. It will be further appreciated that some embodiments may use non-threaded coupling mechanisms to secure the insert 400 to the flange and/or cooling block. In some embodiments, the base 405 may be formed to include the flange, such that a base of the flange includes a coupling mechanism for coupling the insert 400 with a cooling block. A circular sidewall 415 extends from the base 405 and defines an open interior 420. The sidewall 415 may further define a number of apertures 425. As illustrated, the apertures 425 are arranged in a number of rows and columns, with the apertures 425 in each row are aligned with the apertures 425 in an adjacent row along a longitudinal axis of the insert 400. As described above, a size, arrangement, and/or number of the apertures 425 may be selected to maintain a proper fluid conductance, while still leaving the insert 400 with sufficient surface area to serve as a collection point for residue from process gases.

Figure 5:
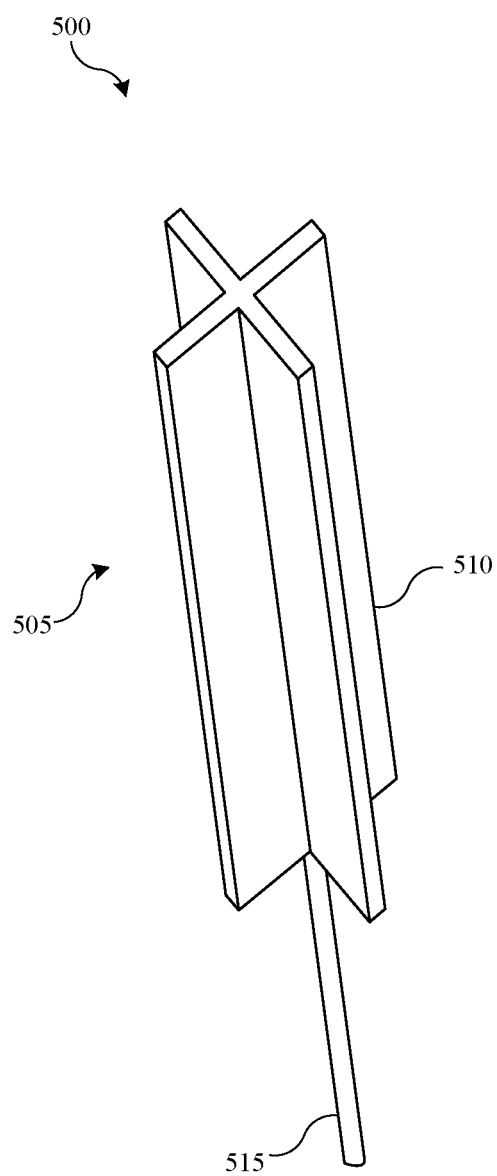
FIG. 5 shows a schematic isometric view of an exemplary removable foreline trap insert according to some embodiments of the present technology.

FIG. 5 shows a schematic isometric view of an exemplary insert 500 according to some embodiments of the present technology. The insert 500 may be included in any chamber or system previously described, as well as any other chamber or system that may benefit from the insert. For example, the insert 500 may be disposed within the trap portion 375 of the foreline trap 360 described above in relation to FIGS. 3 and 3A. Insert 500 may include a body 505 that serves as a collection point for residue from process gases that pass through the foreline trap. As illustrated, the body 505 of insert 500 has a cross-shaped cross-section that includes a number of wings 510 that provide a large surface area on which to collect residue. Each wing 510 may have a thickness that is selected to enable sufficient conductance through the foreline trap and throttle valve. For example, each wing 510 may have a thickness of less than or about 0.50 inches, less than or about 0.40 inches, less than or about 0.30 inches, less than or about 0.25 inches, less than or about 0.20 inches, less than or about 0.15 inches, less than or about 0.10 inches, less than or about 0.05 inches, or less. In some embodiments, thickness of the wings 510 of the insert 500 may vary along a length of the insert 500. For example, the thickness of the wings 510 may be greater near a bottom of the insert 500 and decrease in a linear or nonlinear manner toward a top of the insert 500. While shown with a cross-shaped cross-section, it will be appreciated that the insert may have any other cross-sectional shape.

The insert 500 may also include a base or stem 515 that supports the insert 500 at a desired position within the foreline trap. For example, the stem 515 may sit atop and/or be coupled with a base of the foreline trap and/or with a top of a flange (such as flange 382). For example, a distal end of the stem 515 may be threaded such that the distal end may be inserted within a threaded receptacle of the flange. The flange may be coupled with the foreline trap in a manner similar to that described in relation to FIGS. 3 and 3A. For example, a flange of the foreline trap and the flange of the insert 500 may be secured to one another via a collar and/or other securement mechanism. While illustrated as a single shaft, base or stem 515 may have any shape. For example, the insert 500 may include a base that extends radially outward along all or part of a width of the wings 510. In some embodiments, the base of insert 500 may have a similar structure as base 405 described above in relation to FIG. 4.

In some embodiments, the body 505 of the insert 500 may define a number of apertures. For example, some or all of the wings 510 may define one or more apertures that may increase the fluid conductance of the insert 500. In some embodiments, each of the apertures may extend through a single wing 510, while in other embodiments one or more apertures may extend through a portion of multiple wings 510.

Figure 6:
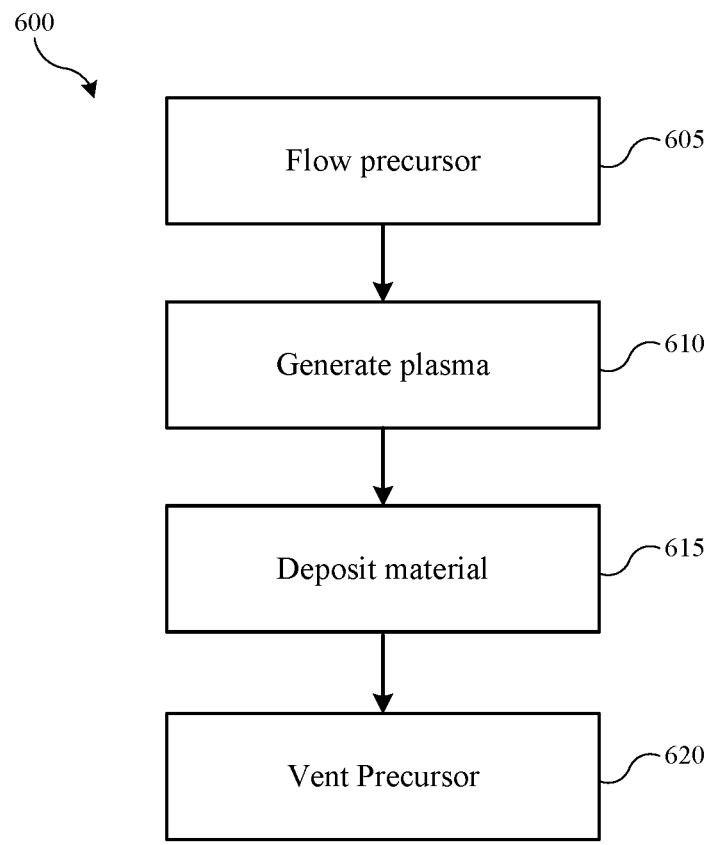
FIG. 6 shows operations of an exemplary method of semiconductor processing according to some embodiments of the present technology.

FIG. 6 illustrates operations of an exemplary method 600 of semiconductor processing according to some embodiments of the present technology. The method may be performed in a variety of processing chambers, including processing system 200 and/or 300 described above, which may include foreline traps and/or inserts according to embodiments of the present technology, such as foreline trap 360 and/or inserts 380, 400, and/or 500. Method 600 may include a number of optional operations, which may or may not be specifically associated with some embodiments of methods according to the present technology.

Method 600 may include a processing method that may include operations for forming a hardmask film or other deposition operations. The method may include optional operations prior to initiation of method 600, or the method may include additional operations. For example, method 600 may include operations performed in different orders than illustrated. In some embodiments, method 600 may include flowing one or more precursors or other process gases into a processing chamber at operation 605. For example, the precursor may be flowed into a chamber, such as included in system 200 or 300, and may flow the precursor through one or more of a gasbox, a blocker plate, or a faceplate, prior to delivering the precursor into a processing region of the chamber.

At operation 610, a plasma may be generated of the precursors within the processing region, such as by providing RF power to the faceplate to generate a plasma. Material formed in the plasma may be deposited on the substrate at operation 615. At operation 620, the precursor may be vented from the processing chamber. For example, the precursor may be flowed through at least one foreline, a foreline trap, and a throttle valve to remove the precursor from the processing chamber. The foreline trap may include an insert, such as insert 380, 400, or 500 which may serve as a collection point for residue from the precursor other process gas, which may prevent or reduce the deposition of residue within the throttle valve. This may help maintain proper conductance through the throttle valve and reduce the amount of throttle valve drift, which in turn may reduce the frequency of cleaning operations.

In some embodiments, to further promote collection of residue on the insert, the insert may be actively cooled as the precursor or other process gas is vented. For example, a cooling fluid, such as water or ethylene glycol, may be circulated or otherwise flowed through a cooling block that is coupled with the insert. The cooling fluid may reduce the temperature of the insert to enhance residue collection.

The insert may be removed from the foreline trap, such as for cleaning or maintenance purposes. For example, when a threshold amount of residue has been collected on the insert, the insert may be removed to be cleaned and/or replaced with a clean insert, which may better collect residue than a dirty insert. In some embodiments, to remove the insert, a collar that couples flanges of the foreline trap and the insert together may be removed. Similarly, the insert and/or flange of the insert may be decoupled from a cooling block to free the insert. A new and/or clean insert may be coupled with the cooling block and reinserted within the foreline trap. In this manner, the insert may be cleaned and/or replaced without the need to clean the forelines and/or throttle valve using high temperature purge gases that could damage chamber components.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
    a processing chamber defining a processing region;
    a foreline coupled with the processing chamber, the foreline defining a fluid conduit;
    a foreline trap having an inlet coupled with a distal end of the foreline;
    a removable insert provided within an interior of the foreline trap, the removable insert comprising a solid base, wherein a distal end of the solid base is removably coupled with a flange, the flange comprising a protrusion;
    a cooling fluid source;
    a cooling block removably coupled with the protrusion of the flange;
    a fluid line coupling the cooling fluid source with the cooling block, wherein the cooling fluid source is configured to circulate a cooling fluid to the cooling block via the fluid line, and wherein physical contact between the cooling block and the protrusion of the flange creates a heat transfer path that reduces a temperature of the removable insert when the cooling fluid is circulated to the cooling block; and
    a throttle valve coupled with an outlet of the foreline trap downstream of the removable insert.

2. The semiconductor processing system of claim 1, wherein:
    the removable insert is characterized by one or more sidewalls that define an open interior; and
    at least one sidewall of the one or more sidewalls defines a plurality of apertures extending through a thickness of the at least one sidewall.

3. The semiconductor processing system of claim 2, wherein:
    each of the plurality of apertures has a diameter of between about 3 mm and 25 mm.

4. The semiconductor processing system of claim 2, wherein:
    each of the plurality of apertures has a circular shape.

5. The semiconductor processing system of claim 2 wherein:
    each of the plurality of apertures has a same diameter.

6. The semiconductor processing system of claim 2, wherein:
    the solid base of the removable insert is coupled with the one or more sidewalls.

7. The semiconductor processing system of claim 2, wherein:
    each of the one or more sidewalls has a thickness of less than or about 0.5 inches.

8. The semiconductor processing system of claim 1, further comprising:
    an additional foreline coupled with the processing chamber, wherein:
        the foreline trap comprises:
            a first inlet fluidly coupled with the foreline;
            a second inlet fluidly coupled with the additional foreline; and
            an outlet fluidly coupled with the throttle valve; and
        the removable insert is disposed downstream of the first inlet and the second inlet and upstream of the outlet.

9. The semiconductor processing system of claim 1, further comprising:
    a collar that removably couples the removable insert with the foreline trap.

10. The semiconductor processing system of claim 1, wherein the cooling block forms a heat transfer path between the removable insert and the fluid line.

* * * * *